United States Patent [19]

Kosinski

[11] 3,930,207

[45] Dec. 30, 1975

[54] AMPLIFIER WITH OVERLOAD PROTECTION

[75] Inventor: Frank J. Kosinski, Hauppauge, N.Y.

[73] Assignee: Unicord, Incorporated, New York, N.Y.

[22] Filed: June 10, 1974

[21] Appl. No.: 477,758

[52] U.S. Cl. .......................... 330/207 P; 307/202 R

[51] Int. Cl.² .......................................... H03F 3/183

[58] Field of Search ............. 330/207 P; 307/202 R; 330/29 C

[56] References Cited

UNITED STATES PATENTS

| | | | |
|---|---|---|---|
| 3,277,386 | 10/1966 | Miyazawa | 330/22 |
| 3,725,739 | 4/1973 | Griffey | 330/207 P X |

FOREIGN PATENTS OR APPLICATIONS

| | | | |
|---|---|---|---|
| 45-32721 | 10/1970 | Japan | 330/207 P |

*Primary Examiner*—James B. Mullins
*Attorney, Agent, or Firm*—Colton & Stone, Inc.

[57] ABSTRACT

A transistor amplifier incorporates a protective circuit which disables the preamplifier stage upon the occurrence of an overload condition thereby removing the drive signals from the power transistors of the amplifier output stage. The protective circuit includes an SCR connected between the preamplifier power supply and ground. Current in the output driver stage is sensed to produce the gating signal for the SCR.

2 Claims, 2 Drawing Figures

AMPLIFIER WITH OVERLOAD PROTECTION

BACKGROUND OF THE INVENTION

The present invention relates to amplifier circuits and, more particularly, to audio amplifier circuits incorporating overload protection for preventing damage to the output stage power transistors in the event of an overload.

Transistor amplifiers are susceptible to damage upon the occurence of an overload condition such as results from the shorting of the output terminals of the amplifier. Such a condition imposes a current drain on the power transistors of the amplifier output stage which is in excess of the dissipative capacity of the transistors. As a consequence, overheating and destruction of the power transistors occur in the absence of some means to limit or interrupt the output stage current. The likelihood of a shorted amplifier output is particularly high with those types of amplifier systems in which the amplifier is connected to the speakers by disconnectable cables and in which frequent movement, connecting and disconnecting of the equipment occurs. Amplifying systems used in the music and entertainment fields are typical examples.

One expedient which has been adapted to provide protection for the amplifier in the event of an overload is the use of fuses in the output circuit. However, the time lag between the beginning of the overload condition and the tripping of the fuse may be longer than the time required for damage or destruction of the power transistors.

The prior art also teaches the use of transistors and zener diodes to limit the dissipation of amplifier power transistors to a percentage of their nominal ratings. Typically, the power dissipation is limited to approximately 30% to 50% of the rated capacity of the transistors. Even with the most conservative limitations, i.e. 30% of rated capacity, the power transistors are required to dissipate a substantial amount of energy and, as a consequence, generate a substantial amount of heat. A continuing shorted output condition subjects the amplifier to repeated periods of heating with potentially destructive results.

It has also been proposed to provide circuit means sensing the power transistor output signal levels and terminating or reducing the drive singals to the output transistors when the sensed signals exceed predetermined safe limits. Such a system is described in Rheaume U.S. Pat. No. 3,448,394. The system of this patent includes an SCR in parallel circuit relation to the preamplifier stage and a biasing circuit furnishing the gating signal to the SCR. The biasing circuit includes a transistor which is responsive to the output signal levels of each of the power transistors of a push-pull output stage and generates a gating signal to render the SCR conductive upon the occurence of an overload condition. The SCR circuit effectively removes the operating bias to the preamplifier stage thus removing the drive signals to the output stage. The circuit of the Rheaume patent is potentially subject to malfunction, however. A failure of the biasing circuit transistor will result either in the loss of the protective feature or in the inoperativeness of the amplifier circuit. The circuit, as disclosed, is also limited to use with amplifiers of the type having a complimentary pair of transistors in push-pull relation and driven by a driver transformer.

It is the primary object of the present invention to provide an amplifier overload protection circuit which is characterized by its simplicity and reliability.

It is also an object of the present invention to provide an overload protection circuit for an audio amplifier which is capable of substantially instantaneous response to the occurence of an overload condition.

A further object of the invention is the provision of an overload protection circuit for an audio amplifier which is operable to remove or reduce the preamplifier output signal in the event of an overload condition which does not require complex interface circuitry for the detection of an overload condition.

SUMMARY OF THE INVENTION

The above and other objects of the invention which will become apparent in the following description of the preferred embodiment of the invention are achieved by the provision, in an amplifier including a preamplifier stage, an output stage, and an output driver stage which receives the output signal of the preamplifier stage and supplies driving signals to the output stage, of a protective circuit which includes an SCR connected between the preamplifier potential source and ground and a gating circuit for the SCR which triggers the SCR to a conductive state when the current of the driver stage exceeds a predetermined level.

For a more complete understanding of the invention and the objects and advantages thereof, reference should be had to the following detailed description and the accompanying drawing wherein there is disclosed a preferred embodiment of the invention.

DESCRIPTION OF THE PREFERRED EMBODIMENTS

Figure 1:
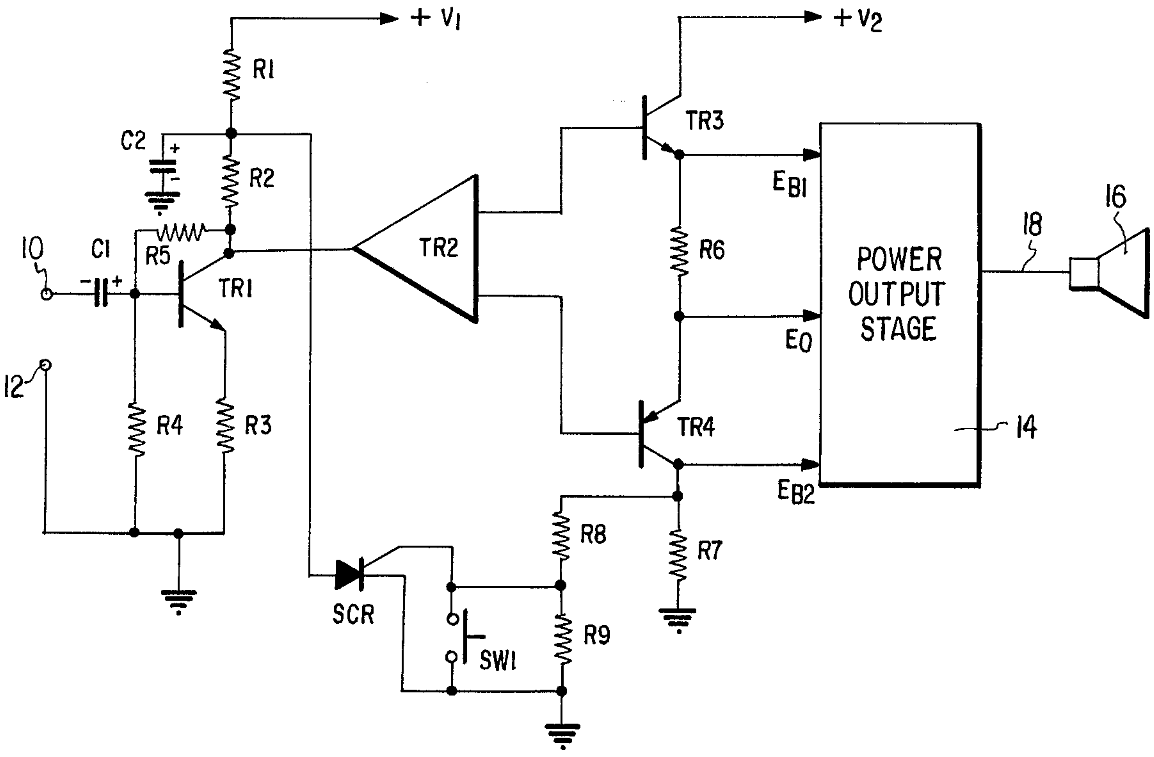
FIG. 1 is a schematic showing of an audio amplifier circuit incorporating a first embodiment of the overload protection circuit of the present invention.

The amplifier circuit illustrated in FIG. 1 includes a preamplifier stage having an amplifying transistor TR1. Signal input connections are provided by the terminals 10 and 12, the terminal 10 being connected to the base of NPN transistor TR1 across capacitor C1 while the terminal 12 is grounded. The collector of transistor TR1 is connected to a supply potential $V_1$ across resistors R1 and R2 and the emitter of the transistor is connected to ground across resistor R3. A base to ground connection for transistor TR1 is provided through resistor R4 while resistor R5 provides a base-collector connection. The output signal of the preamplifier stage, derived from the collector of transistor TR1, is supplied to a preamplifier driver TR2 which in turn, furnishes driving signals to an output driver stage.

The output driver stage includes transistors TR3 and TR4 arranged in a quasi-complimentary push-pull configuration. The driving signals from preamplifier driver stage TR2 are supplied to the bases of the transistors TR3 and TR4. The transistors TR3 and TR4 are NPN and PNP transistors, respectively, having their emitters connected through a resistor R6. The collector of transistor TR3 is connected to a supply potential $V_2$ and the collector of transistor TR4 is grounded through resistor R7. Driving signals to a power output stage 14 are derived from the emitter of transistor TR3, terminal $E_{B1}$, and the emitter and collector of transistor TR4, terminals $E_O$ and $E_{B2}$, respectively. The power output stage 14 drives a load 16, typically, a loud speaker. Suitable conductors 18, such as disconnectable cables, are employed to couple the power output stage 14 to the load 16.

The amplifier circuit thus far described is of, essentially, conventional configuration. In the event a shorted output condition occurs, for example, a short develops in the connecting cables 18 or across the output terminals of the power output stage 14, the amplifier is susceptible to destruction as the power transistors of the stage 14 are overloaded. In order to prevent this occurence, the present invention provides a protective circuit which senses the presence of an overload condition and instantaneously cuts off the preamplifier signal thereby removing the drive signals from succeeding amplifier stages and eliminating the damaging high current in the power output stage.

The overload protection circuit incorporates a controlled conduction device connected in a circuit between the supply potential of the preamplifier transistor TR1 and ground and controlled so as to be conductive upon the occurence of an overload condition to render the preamplifier inoperative. In the illustrated embodiment, the controlled conduction device is a silicon controlled rectifier SCR having its anode connected to the junction of resistors R1 and R2 in the potential supply circuit of transistor TR1 and its cathode connected to ground. Resistors R8 and R9 are connected in series with one another and in parallel to resistor R7. The gate of the SCR is connected to the junction of resistors R8 and R9. The gate of the SCR is also connected to a normally open switch SW1, the opposite side of which is grounded. The switch SW1 is preferably a momentary contact push button switch. A capacitor C2 is connected between the junction of resistors R1 and R2 and ground.

Under normal operating conditions, the SCR is nonconducting as the voltage drop across resistor R7 is insufficient to trigger the SCR through resistor R8. Consequently, the amplifier circuit operates in the normal manner. When an overload condition occurs, increased drive is required for the power transistors of the power output stage 14. As the drive current increases, the voltage drop across resistor R7 increases to a level sufficient to trigger the SCR on. Conduction of the SCR lowers the supply potential to the collector-emitter circuit of preamplifier transistor TR1 sufficiently to cut off transistor TR1. With transistor TR1 cut off, the amplifier is in an inoperative state, no drive signals being provided to the bases of transistors TR3 and TR4 and, consequently, no drive signals being provided to the power output stage 14.

Following correction of the shorted condition, for example, by the replacement of a defective cable 18, the switch SW1 is momentarily closed grounding the gating signal to the SCR. The SCR is thus returned to its nonconducting state and the amplifier circuit is returned to its operative condition. Should the switch SW1 be closed before the fault is corrected, the SCR will immediately return to its conductive state upon release of the switch SW1 and the amplifier will remain in its inoperative state. Resetting of the amplifier circuit to its operative condition will also occur if the amplifier is shut off for a sufficient length of time to permit the potential on the SCR to decay.

It should be noted that the response of the protection circuit to an overload condition is substantially instantaneous. A typical cut off time is 50 nano-seconds from the inception of an overload. This brief time interval assures that the amplifier components are not subjected to potentially destructive heating.

Figure 2:
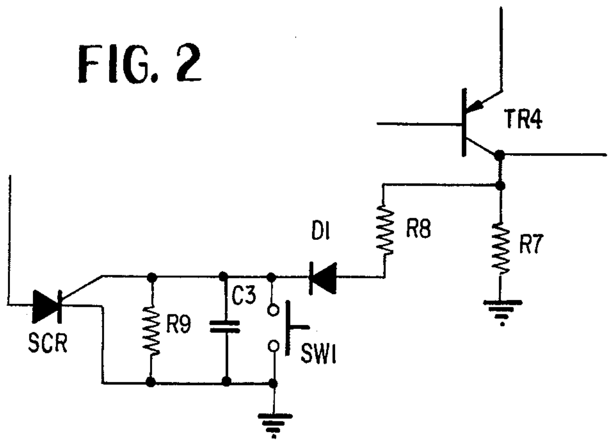
FIG. 2 is schematic showing of a second embodiment of the overload protection circuit of the present invention.

A modified form of the overload protection circuit of the present invention adapted for use with audio amplifiers which are operated at extreme high power output levels is shown in FIG. 2. Only so much of the circuit as is necessary to illustrate the modification is shown in FIG. 2, the remainder of the amplifier circuit being identical to that of FIG. 1.

While most audio amplifiers are never operated at levels approaching the maximum power output level of the amplifier, operation under extreme high power output conditions is a common practice of rock musicans. Upon the occurance of a shorted output while an amplifier is operating under extreme high power output conditions, the SCR will be triggered to the conductive state as described above. However, since the audio signal at the emitter of transistor TR4 is of high amplitude under these operating conditions, the negative going portion of the signal may be of sufficient amplitude as to cause the SCR to return to its nonconductive state. Consequently, the SCR is repeatedly switched on and off and full overload protection is not provided by the circuit of FIG. 1. It should be understood that this switching on and off occurs only under conditions of extreme high power output operation since at lower operating levels the negative going portion of the audio signal is of insufficient magnitude to affect the SCR. Thus, the circuit of FIG. 1 does provide adequate protection for amplifiers operating within normal levels.

In the overload protection circuit of FIG. 2, a diode is interposed between the resistor R8 and the junction of resistor R9 and the gate of the SCR. A capacitor C3 is also provided, the capacitor C3 being in parallel connection with the resistor R9. The diode D1 prevents capacitor C3 from discharging through resistors R8 and R7. Upon the occurance of an overload condition, the potential across resistor R7 during the positive going portion of the audio signal at the emitter of transistor TR4 is sufficient to trigger SCR to its conductive state. During the negative going portion of the audio signal, the potential across capacitor C3 assures that the SCR remains in its conductive state, the diode D1 preventing the charge on capacitor C3 from decaying at an overly rapid rate. As with the embodiment of FIG. 1, conduction of the SCR removes the operating potential from preamplifier transistor TR1, thus removing the drive signals from successive amplifier stages.

Resetting of the amplifier to its operative state following correction of the shorted output condition is accomplished in the same manner as in the circuit of FIG. 1.

I claim:

1. In an amplifier circuit having a preamplifier stage, power supply means for said preamplifier stage, an output stage, an output driver stage responsive to the output signal of said preamplifier stage and driving said output stage, said output driver stage including a pair of driver transistors connected in quasicomplimentary push-pull configuration whereby the emitter of one of said transistors provides a first driving signal to said output stage and the collector of the other of said transistors provides a second driving signal to said output stage, power supply means for said output driver stage, one side thereof being connected to the collector of one of said transistors and the other side thereof being connected through a first resistor to the collector of the other of said transistors, an overload protection circuit, comprising:

a silicon controlled rectifier connected to said preamplifier power supply means through the anode and cathode terminals of the silicon controlled rectifier and in parallel circuit relation to the power connections of said preamplifier stage; and a gating circuit for said silicon controlled rectifier comprising second and third resistors in series connection with one another and in parallel connection with said first resistor and conductor means directly connecting the gate of said silicon controlled rectifier to the junction of said second and third resistors, the arrangement being such that said silicon controlled rectifier is gating into its conductive state when the current drain through said first resistor exceeds a predetermined level.

2. The circuit of claim 1 further including a capacitor in parallel connection with said third resistor and a diode between said second resistor and said junction to prevent discharge of said capacitor through said second resistor.

* * * * *